(12) United States Patent
Chelliah et al.

(10) Patent No.: US 9,031,997 B2
(45) Date of Patent: May 12, 2015

(54) LOG FILE COMPRESSION

(75) Inventors: Gopikrishnan Chelliah, Madurai (IN); Hariharan L. Narayanan, Thanjavur (IN); Arun Ramakrishnan, Chennai (IN); Rohit Shetty, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 767 days.

(21) Appl. No.: 13/280,569

(22) Filed: Oct. 25, 2011

(65) Prior Publication Data

US 2013/0103982 A1 Apr. 25, 2013

(51) Int. Cl.
- G06F 17/30 (2006.01)
- H02H 3/05 (2006.01)
- H03M 7/30 (2006.01)

(52) U.S. Cl.
CPC ............ *H03M 7/707* (2013.01); *H03M 7/3088* (2013.01)

(58) Field of Classification Search
CPC ... G06F 17/30153; G06F 17/40; H03M 7/707
See application file for complete search history.

(56) References Cited

U.S. PATENT DOCUMENTS

| | | | |
|---|---|---|---|
| 6,400,293 B1 | 6/2002 | Richardson | |
| 7,548,928 B1 | 6/2009 | Dean et al. | |
| 7,827,148 B2 | 11/2010 | Mori et al. | |
| 7,890,511 B2 | 2/2011 | Valimaki et al. | |
| 2005/0246362 A1 | 11/2005 | Borland | |
| 2006/0195554 A1* | 8/2006 | Payne et al. | 709/219 |
| 2008/0294740 A1* | 11/2008 | Grabarnik et al. | 709/206 |
| 2010/0011031 A1* | 1/2010 | Huang et al. | 707/202 |

OTHER PUBLICATIONS

Delta Encoding, accessed on Oct. 12, 2011, online from http://en.wikipedia.org/wiki/Delta_encoding, 5 pages.
Huffman encoding, accessed on Oct. 12, 2011, online from http://en.wikipedia.org/wiki/Huffman_coding, 11 pages.
Data Compression, accessed on Oct. 12, 2011, online at http://en.wikipedia.org/wiki/Data_compression, 6 pages.
Frederick John Otten, Using Semantic Knowledge to Improve Compression on Log Files, Jun. 2008, available online at http://eprints.ru.ac.za/1660/1/OttenMSc-TR09-39.pdf, 240 pages.
Marc Girardot et al., Millau: An Encoding Format for Efficient Representation and Exchange of XMLOVER the Web, Mar. 16, 2006, available online at http://www2.cs.uni-paderborn.de/cs/ag-boettcher/lehre/WS06/sem-ws06-xml-comp/Literatur/Millau%20%20a%20bin-ary%20encoding%20format%20for%20XML%20documents.pdf, 23 pages.

* cited by examiner

*Primary Examiner* — Tarek Chbouki
(74) *Attorney, Agent, or Firm* — William J. Stock; Amy J. Pattillo

(57) ABSTRACT

A compression system identifies one or more fields in a log file based on at least one field rule from among multiple field rules specified in a log file framework. The compression system extracts contents of the log file associated with the one or more fields. The compression system passes the contents associated with the one or more fields to corresponding compression engines from among a multiple compression engines each specified for performing a separate type of compression from among multiple types of compression for each of the one or more fields, wherein each of the one or more fields corresponds to one or more compression engines from among the multiple compression engines.

19 Claims, 6 Drawing Sheets

LOG FILE COMPRESSION

BACKGROUND

1. Technical Field

The embodiment of the invention relates generally to data processing systems and particularly to compression of a log file.

2. Description of Related Art

Many applications, operating systems, and other components generate log files that include a record of component activities, detected data, and other information. The file sizes of log files generated by one application, as well as by different components, may vary. In one example, one application may generate multiple log files with file sizes ranging from a few bytes to a Giga Byte (GB).

Log files are often stored in a database and transferred over a network between systems for use by programmers, service personnel and others in identifying problems with a product or service. As the size of a log file increases, the storage resources, network resources, and time required to store or transfer the log file also increases.

BRIEF SUMMARY

In view of the foregoing, there is a need for a method, system, and computer program product for efficiently compressing log files for reducing the network resources, storage resources, and time required to store, transfer, or output log files. In particular, there is a need for a method, system, and computer program product for efficiently compressing log files generated with one or more fields specified by an underlying log file framework and with redundant data in at least one of the one or more fields.

In one embodiment of the invention, a method for compressing a log file is directed to identifying, by one or more processors, two or more fields in a log file based on two or more field rules from among multiple field rules specified in a log file framework. The method is directed to extracting, by the one or more processors, contents of the log file associated with the two or more fields. The method is directed to passing, by the one or more processors, the contents associated with the two or more fields to two or more corresponding compression engines from among multiple compression engines each specified for performing a separate type of compression from among multiple types of compression for each of the two or more fields, wherein each of the two or more fields corresponds to one or more compression engines from among the multiple compression engines. The method is directed to receiving, by the one or more processors, multiple outputs from each of the one or more compression engines, wherein the multiple outputs comprise compressed contents and uncompressed contents, wherein the compressed contents comprise at least one content element replaced by one or more of the two or compression engines by a dictionary entry index into at least one entry in a dictionary shared among the two or more compression engines for replacing redundant elements among the two or more compression engines. The method is directed to identifying, by the one or more processors the at least one dictionary entry index in the compressed contents wherein the at least one dictionary entry index is an index value assigned by the one or more compression engines to a text string in the dictionary. The method is directed to arranging, by the one or more processors, the compressed contents, uncompressed contents, and each text string from the dictionary associated with each identified at least one dictionary entry index in a predefined format for a compressed log file. The method is directed to outputting, by the one or more processors, the compressed log file.

Another embodiment of the invention provides a system for compressing a log file. The system includes one or more processors and a compression system, for execution by at least one of the one or more processors. The compression system identifies two or more fields in a log file based on two or more field rules from among multiple field rules specified in a log file framework. The compression system extracts contents of the log file associated with the two or more fields. The compression system passes the contents associated with the two or more fields to two or more corresponding compression engines from among multiple compression engines each specified for performing a separate type of compression from among multiple types of compression for each of the two or more fields, wherein each of the two or more fields corresponds to one or more compression engines from among the multiple compression engines. The compression system receives multiple outputs from each of the two or more compression engines, wherein the multiple outputs comprise compressed contents and uncompressed contents, wherein the compressed contents comprise at least one content element replaced by one or more of the two or more compression engines by a dictionary index into at least one entry in a dictionary shared among the two or more compression engines for replacing redundant elements among the two or more compression engines. The compression system identifies the at least one dictionary entry index in the compressed contents, wherein the at least one dictionary entry index is an index value assigned by the one or more compression engines to a text string in the dictionary. The compression system arranges the compressed contents, uncompressed contents, and each text string from the dictionary associated with each identified at least one dictionary entry index in a predefined format for a compressed log file. The compression system outputs the compressed log file.

Another embodiment of the invention includes a computer program product for compressing a log file. The computer program product includes one or more computer-readable, tangible storage devices. In addition, the computer program product includes program instructions, stored on at least one of the one or more storage devices, to identify two or more fields in a log file based on two or more field rules from among multiple field rules specified in a log file framework. The computer program product includes program instructions, stored on at least one of the one or more storage devices, to extract contents of the log file associated with the two or more fields. The computer program product includes program instructions, stored on at least one of the one or more storage devices, to pass the contents associated with the two or more fields to corresponding compression engines from among multiple compression engines each specified for performing a separate type of compression from among multiple types of compression for each of the two or more fields, wherein each of the two or more fields corresponds to one or more compression engines from among the multiple compression engines. The computer program product includes program instructions, stored on at least one of the one or more storage devices, to receive multiple outputs from each of the two or more compression engines, wherein the multiple outputs comprise compressed contents and uncompressed contents, wherein the compressed contents comprise at least one content element replaced by one or more of the two or more compression engines by a dictionary entry index into at least one entry in a dictionary shared among the two or more compression engines for replacing redundant elements among the two or more compression engines. The computer program product includes program instructions, stored on at least one of the one or more storage devices, to identify the at least one dictionary entry index in the compressed contents wherein the at least one dictionary entry index is an index value assigned by the one or more compression engines to a text string in the dictionary. The computer program product includes program instructions stored on at least one of the one or more storage devices, to arrange the compressed contents, uncompressed contents and each text string from the dictionary associated with each identified at least one dictionary entry index in a predefined format for a compressed log file. The computer program product includes program instructions, stored on at least one of the one or more storage devices, to output the compressed log file.

BRIEF DESCRIPTION OF SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

The description now turns to the figures. The one or more embodiments of the invention may be understood by reference to the figures. The following description is intended only by way of example and simply illustrates one or more embodiments of the invention as claimed herein.

Figure 1:
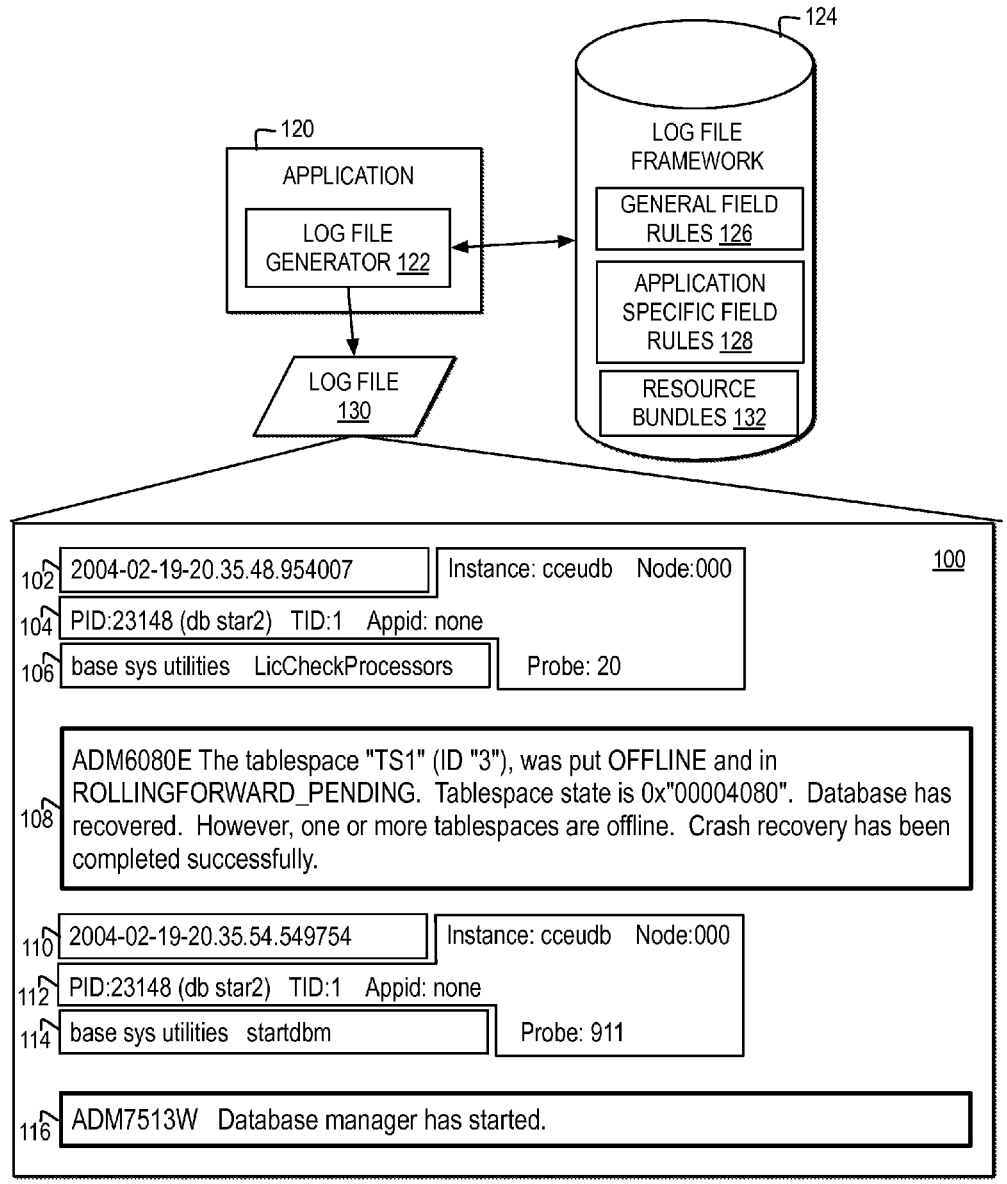
FIG. 1 illustrates a block diagram of one embodiment of a log file including multiple fields generated based on a field rules in a log file framework.

FIG. 1 illustrates a block diagram of one embodiment of a log file including multiple fields generated based on field rules specified in a log file framework. In the example, while application 102 is processed, a log file generator 122 generates a log file 130 for application 120. Application 120 may represent one or more types of applications, operating systems, and other functional elements for which activity can be monitored and log files generated by log file generator 122. Log file generator 122 may generate log files for additional or alternate applications. Log file 130 may include one or more entries for one or more types of actions, data, or other events monitored for and generated by log file generator 122 including, but not limited to, error messages and records of all inputs to and outputs from a particular system.

In the example, log file generator 122 generates the content of log file 130 based on a predefined set of rules and other specifications defined by a log file framework 124. In particular, log file generator 122 generates specific types of content and places the content within one or more fields, where each type of field is specified by the predefined set of rules and other specifications in log file framework 124. In one embodiment, log file framework 124 includes general field rules 126 that specify rules for fields common across multiple log files, includes application specific field rules 128 that specify rules for fields specific to a particular application or type of application for which log file creator 122 is generating log file 130, and includes resource bundles 132 that specify the localized bundles of text strings available for formatting messages in a log file. Log file framework 124 may represent data locally stored and accessible by log file creator 122 or data distributed across one or more systems communicatively connected over a network. In another embodiment, log file framework 124 may include additional or alternate types of rules and specifications.

By log file generator 122 generating log file 130 based on log file framework 124, multiple functional tools with access to log file framework 124 have access to the format of log file 130 and may use log file framework 124 identify the fields within log file 130. In one example, a log analyzer tool with access to log file framework 124 may automatically identify the fields within log file 130 and analyze the contents of a selection of fields to determine the problems that have occurred in one or more applications. In another example, as described herein, for compressing log file 130, a record extractor may automatically identify the fields within log file 130 based on log file framework 124, extract the contents from the fields, and distribute the contents of each field to a corresponding compression engine specified for each field for optimizing compression of log file 130.

In particular, by generating log files based on log file framework 124, although the specific contents and application specific fields in log files may vary for different applications and log file generators, log file framework 124 provides a consistent structure for log files. Within the consistent structure of log files based on log file framework 124, some types of fields repeated throughout a log file will include redundant contents or similar contents and some contents will repeat across multiple types of fields. Because of the consistent structure of log files generated based on log file framework 124 and because of the redundancy of data within specific fields of log files, compression of log files may be optimized by specifying each compression engine receiving contents of log files to use a different type of compression technique to compress the contents received from a particular type of field to optimize the compression of the contents of that particular type of field and by sharing a compression dictionary for replacing redundant terms among the different compression engines.

In one embodiment, log files, such as log file 130, generated by one or more log file generators, such as log file generator 122, based on log file framework 124 include fields corresponding to a data message, time, component, sub component, severity and range of values that are generated when an application is executed and processed based on the instance of the application and the environment in which the application executes. In one embodiment, log entries 100 illustrate one example of multiple entries within log file 130. Log entries 130 includes multiple fields generated by log field generator 122 based on log file framework 124 including, but not limited to, a field 102, a field 104, a field 106, a field 108, a field 110, a field 112, and a field 114. In the example, fields 108 and 116 are data message fields, fields 102 and 110 are time fields that show the time when each entry of the log file following the time field was created, fields 104 and 112 are environment specific values captured at runtime, and fields 106 and 114 are component and subcomponent fields.

In the example, the times captured in fields 102 and 110 show the times when each entry of log entries 130 was created. For example, field 102 includes time contents of "2004-02-19-20.35.48.954007" and field 110 includes time contents of "2004-02-19-20.35.54.549754". In the example, the time contents of fields 102 and 110 use a consistent format of "XXX-XX-XX-XX.XX.XX.XXXXXX". In one example, a compression engine for compressing the contents of time fields may be specified for optimized compression of contents using a consistent time format.

In the example, the environment specific values captured in fields 104 and 112 may include environment identifiers including, but not limited to, a Process Identifier (PID), a Thread Identifier (TID), and an Instance Identifier (Instance). In one example, a PID includes information regarding a process of log file generator 122 that created log file 130, a TID includes information about a thread of log file generator 122 that created log file 130, and an Instance includes information about an instance of an application that created log file 130. For example, field 104 includes environment specific contents of "PID:23148 (dbstar2) TID:1 APPID: none Instance: cceudb Node: 000 Probe: 20" and field 112 includes environment specific contents of "PID:23148 (dbstar2) TID:1 APPID: none Instance: cceudb Node:000 Probe:911". In the example, the environment specific values captured in fields 104 and 112 are redundant other than the "Probe" value. In one example, a compression engine for compressing the contents of environment specific values may be specified for optimized compression of generally redundant content elements.

In the example, the components and subcomponents captured in fields 106 and 114 may include information about the components of a system that create a log file that are predefined and specific to log file generator 122 or another application creating log file 130. For example, field 106 includes component and subcomponent contents of "base sys utilities LicCheckProcessor" and field 114 includes component and subcomponent contents of "base sys utilities startdbm". In the example, since the component and subcomponent values captured in fields 106 and 114 are predefined components, a compression engine for compressing the contents of component and subcomponent specific values may be specified for optimized compression of predefined values.

In the example, the messages captured in fields 108 and 116 may include text strings. For example, field 108 includes a text string of "ADM6080E The tablespace "TS1" (ID "3"), was put OFFLINE and in ROLLINGFORWARD_PENDING. Tablespace state is 0x"00004080". Database has recovered. However, one or more tablespaces are offline. Crash recovery has been completed successfully" and field 116 includes a text string of "ADM7513W Database manager has started." In the example, since the text strings of the messages in fields 108 and 116 are specified and formatted based on messages in resource bundles 132, a compression engine for compressing the contents of data messages may be specified for optimized compression of redundant text strings within resource bundles 132.

Figure 2:
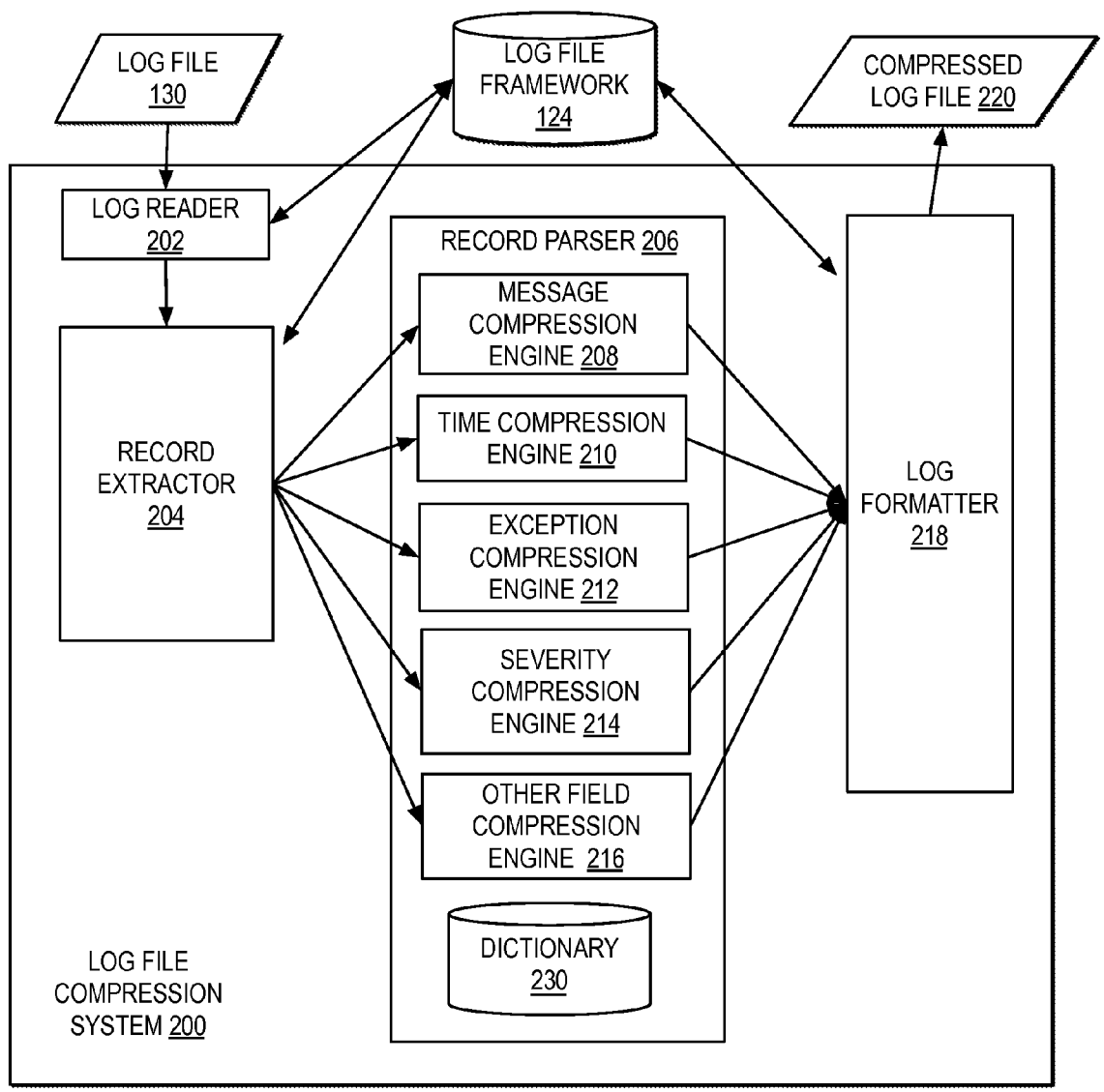
FIG. 2 illustrates a block diagram of one embodiment of a log file compression system for optimized compression of log files.

FIG. 2 illustrates a block diagram of one embodiment of a log file compression system for optimized compression of log files. In one embodiment, a log file compression system 200 includes a log reader 202, a record extractor 204, a record parser 206, and a log formatter 218. Record parser 206 includes multiple compression engines that each compress inputs based on predefined rules specified for the particular type of compression to be performed by each of the compression engines from among multiple types of compression. In addition, the compression engines of record parser 206 are each specified for one or more particular types of fields from among the types of fields defined by the rules in log file framework 124.

In the example, log reader 202 receives log file 130, identifies log file framework 124 for log file 130, reads log file 130 based on log file framework 124, and passes the read file to record extractor 204. Record extractor 204, based on the field rules applicable to log file 130 in log file framework 124, identifies at least one predefined fields in the log file and splits each of the identified fields of log file 130 into separate records. Record parser 206 parses the associated data and contents from each separate records, tokenizes the data in association into separate components each associated with one of the identified fields, and passes the components to the corresponding compression engine specified for the type of field in the component.

In one embodiment, record parser 206 includes multiple compression engines each specified for different types of fields from among the multiple fields identified in log file framework 124. As illustrated, examples of the compression engines include, but are not limited to, a message compression engine 208, a time compression engine 210, an exception compression engine 212, a severity compression engine 214 and any other field compression engine 216. Each of message compression engine 208, time compression engine 210, exception compression engine 212, severity compression engine 214 and other field compression engine 216 implements a specific and predefined technique for compressing the input data. In addition, the specific and predefined technique implemented by each compression engine is specified to optimize compression of the contents from one or more of the fields identified in log file framework 124.

In one example, record extractor 204 receives a log file entry of "[Mon 23 May 2005 11:30:23 IST] ERROR ANE0345 The specified file C:/missingfile.txt could not be found". In the example, record extractor 204 splits the time field into a record of "[Mon 23 May 2005 11:30:23 IST]" and record parser 206 passes "[Mon 23 May 2005 11:30:23 IST]" to time compression engine 210. In the example, record extractor 204 splits severity field into a record of "ERROR" and record parser 206 passes "ERROR" to severity compression engine 214. In the example, record extractor 204 splits the message field into a record of "ANE0345 The specified file C:/missingfile.txt could not be found" and record parser 206 passes "ANE0345 The specified file C:/missingfile.txt could not be found" to message compression engine 208.

In addition, the specific and predefined technique implemented by each compression engine may include access, by one or more of the compression engines, to a dictionary 230 that includes indexed entries. In one example, dictionary 230 may include static entries for text elements that may or may not be redundant within a log file, indexed from resource bundles 132, application specific field rules 128, and product information, prior to runtime. During runtime, compression engines may access the index values assigned to static entries for text elements and replace the elements with the static entries. In addition, dictionary 230 may include runtime entries for text elements specific to the environment in which a log file is being created, such as thread identifiers, process identifiers, hostnames, and filenames. During runtime, any of the compression engines may identify new text elements in component records and index the new text elements in dictionary 230 to improve compression of redundant components within a log file.

Figure 3:
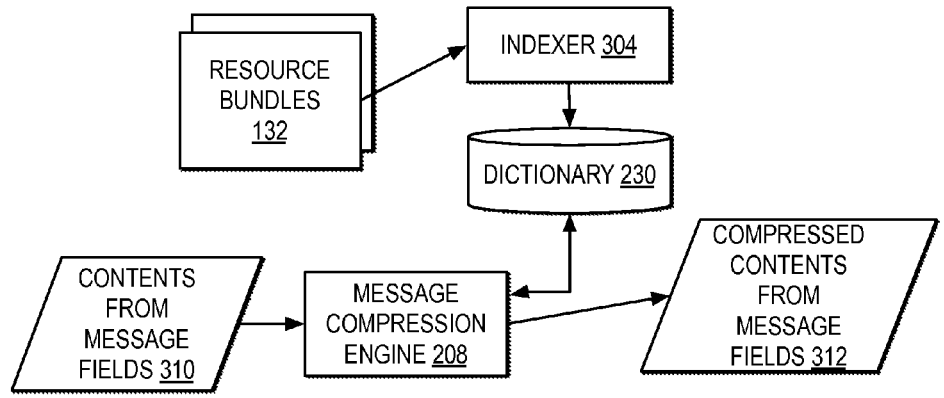
FIG. 3 illustrates one embodiment a block diagram of a message compression engine specified for optimizing compression of messages identified in message fields of log files.

In one example, message compression engine 208 operates on a field of log file 130 that includes messages. Referring now to FIG. 3, FIG. 3 illustrates one embodiment a block diagram of message compression engine 208, specified for optimizing compression of messages in message fields of log files. In the example, the contents from message fields 310 includes the contents tokenized by resource parser 206 into components from one or more message fields identified in log file 130 by record extractor 204.

To optimize compression of messages from log files, since most of the messages in log files are based on the messages and formatting specified in resource bundles 132, message compression engine 208 builds static entries into dictionary 230 with one or more indexed keys and files names. In one example, an indexer 304 accesses resource bundles 132 and indexes entries from resource bundles 132 into dictionary 230. For example, if a resource bundle file in resource bundle 132 contains an entry "FILE_NOT_FOUND_ERR=ANE0345 The specified file {0} could not be found" as the third entry in resource bundle 132 and if this entry is found in a file called "Prdt_Error_msgs.properties" that is the sixth file in resource bundles 132, if all the resource bundles names are sorted alphabetically, then indexer 304 may add an entry of "ANE0345 The specified file * could not be found"=FILE_NOT_FOUND_ERR" in dictionary 230 and indexer 304 may index the entry to "6<space>3", representing the sixth file and the third key entry in the file. If message compression engine 208 receives content from message fields 310 with an entry of "ANE0345 The specified file C:/missingfile.txt could not be found", message compression engine 208 looks up the text string in dictionary 230 and compresses the text string by replacing the text string with "6 3 {C:/missingfile.txt}, where "6 3" is the index entry "6<space>3" assigned to the string "ANE0345 The specified file * could not be found".

In addition, to optimize compression of messages in log files, at runtime, message compression engine 208 identifies environment specific text strings in contents from message fields 310 and builds runtime entries into dictionary 230 by adding an index value for the text strings in dictionary 230. For example, message compression engine 208 identifies a runtime text string of "C:/missingfile.txt" in the compressed text string "6 3 {C:/missingfile.txt}" and indexes "C:/missingfile.txt" in dictionary 230 with an index of "1". Message compression engine 208 further compresses "6 3 {C:/missingfile.txt}" to "6 3 {1}" where "6 3 {1}" each reflect an indexed entry in dictionary 230, and outputs "6 3 {1}" as compressed contents from message fields 312. Message compression engine 208 may replace the text string "C:/missingfile.txt" in other message entries in log file 130 or other log files with an index of "{1}" reflecting the indexed entry in dictionary 230.

Returned to FIG. 2, in one embodiment, time compression engine 210 compresses time associated with log file 130. Record parser 206 parses out the time content from time fields of log file 130 and passes the time content to time compression engine 210. Generally, all log files include the time each entered event occurred in one or more types of formats. In one example, the time field may a time formatted with one or more elements including, but not limited to, date, day, month, year, hour, minute, second, millisecond, and time-zone. If the time format used throughout a log file is consistent, then time compression engine 210 may, at runtime, store the format and the time of the first time entry in the log file and replace subsequent time entries with the time difference between the subsequent entry and the first time entry. In one example, time compression engine 210 receives content records parsed from time fields for a log file with a first content record of "[Mon 23 May 2005 11:30:23 IST]" and a second content record of "[Mon 23 May 2005 11:30:24 IST]". Time compression engine 210 may index "[Mon 23 May 2005 11:30:23 IST]" in dictionary 230 with an index of "time 0", replace the first content record with "[0]", where "0" references the indexed value in dictionary 230, and replace the second content record with "[1000]", where "1000" represents the difference in milliseconds from the time recorded in the first content record to the time recorded in the second content record.

In another example, exception compression engine 212, severity compression engine 214, and other field compression engines 216 may add static entries to dictionary 230 based on predetermined content from log file framework 124 or from product information specific to an application or service. Product information included in the component field, sub-component field, and severity fields, for example, may include known text strings that may be added to dictionary 230 prior to runtime. For example, a severity field may redundantly include the text string of "ERROR" throughout a log file, where "ERROR" is indexed as a static entry in dictionary 230 by severity compression engine 214 and at runtime, severity compression engine 214 replaces the text string "ERROR" with the index value for the text string in dictionary, such as an index value of "1".

In addition, exception compression engine 212, severity engine 214, and other field compression engines 216 may add runtime entries to dictionary 230 to add entries specific to an environment in which the log file is generated. Environment specific entries, such as hostnames, may be redundant in text strings throughout a log file. By indexing potentially redundant text strings to dictionary 230, as the compression engines identify the same text string in multiple components for a log file, the compression engines replace the same text string with an index value for the text string in dictionary 230.

In one embodiment, dictionary 230 may represent a single dictionary. In another embodiment, dictionary 230 may represent multiple separate dictionaries, each maintained based on the type of contents, to reduce the length of keys created for each dictionary. In addition, separate compression engines may maintain separate dictionaries within dictionary 230. Further, multiple record parsers may share one or more portions of dictionary 230.

In the embodiment, each compression engine outputs compressed content to log formatter 218. Log formatter 218 formats the compressed contents, serializes dictionary 230 with the compressed contents, and outputs a compressed log file 220. In one example, as previously described, in a log file entry of "[Mon 23 May 2005 11:30:23 IST] ERROR ANE0345 The specified file C:/missingfile.txt could not be found", time compression engine 212 compresses "[Mon 23 May 2005 11:30:23 IST]" to an index value of "[0]", severity compression engine 214 compresses "ERROR" to an index value of "1", and message compression engine compresses "ANE0345 The specified file C:/missingfile.txt could not be found" to indexed values of "6 3 {1}". Log formatter 218 receives the compressed outputs from time compression engine 210, severity compression engine 214, and message compression engine 208 and formats the compressed outputs into a compressed log file entry of "[0] 1 6 3 {1}" and serializes the dictionary entries for the indexed values from dictionary 230 for output in compressed log file 220. Log formatter 218 may output compressed log file 220 in multiple ways including, but not limited to, storing compressed log file 220 in memory, transferring compressed log file 220 over a network, and outputting compressed log file 220 for display. In addition, log formatter 218 may pass the compressed outputs from the individual compression engines or may pass compressed log file 220 to additional compression engines, external to log compression system 200, for the outputs to be further compressed.

Figure 4:
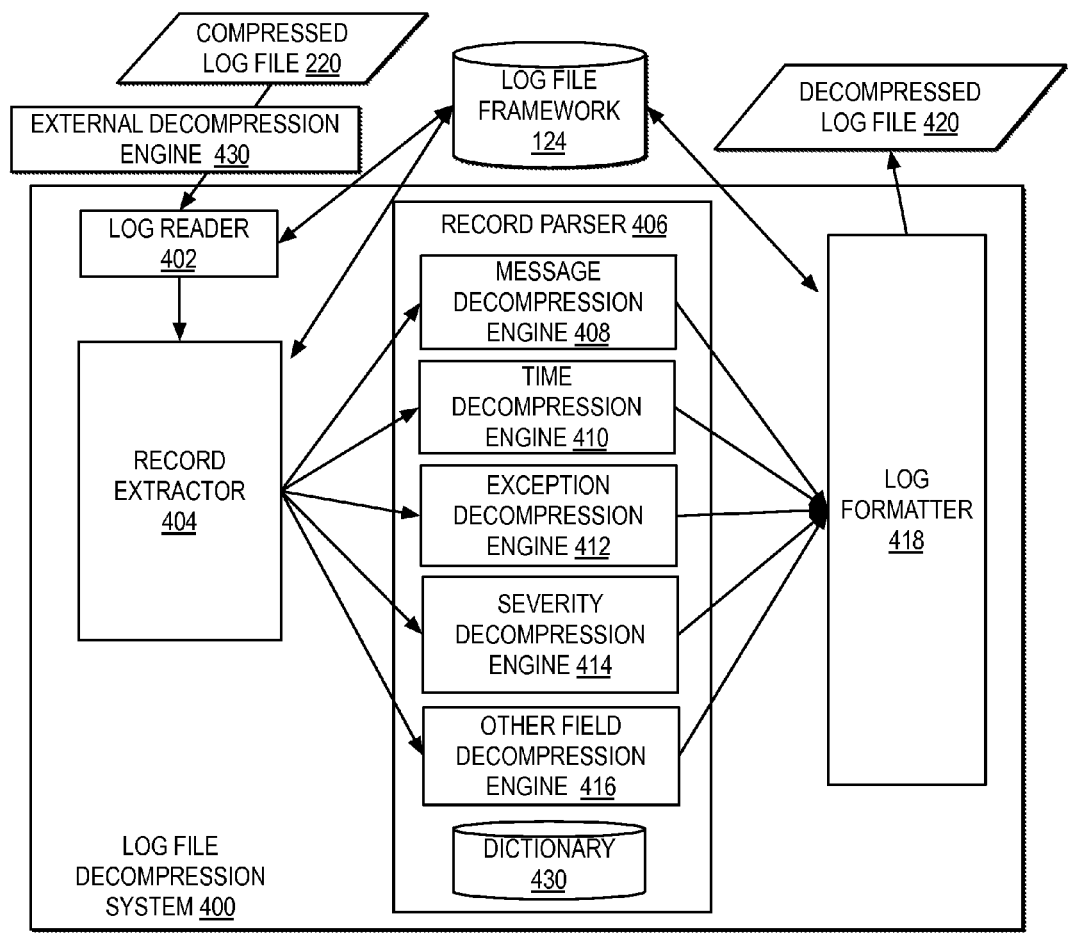
FIG. 4 illustrates a block diagram of one embodiment of a log file decompression system for decompressing compressed log files.

FIG. 4 illustrates a block diagram of one example of a log file decompression system for decompressing compressed log files. In one embodiment, a log file decompression system 400 may decompress compressed log file 220, reversing the steps performed by log file compression system 200. For decompression, if compressed log file 220 was further compressed using a compression engine external to log file compression system 200, compressed log file 220 is first fed to an external decompression engine 430 to decompress compressed log file 220 and to identify the intended format of the compressed log file to be passed on to a log reader 402. Log reader 402 reads compressed log file 220 and passes the read log file to a record extractor 404. Record extractor 404 splits the log file into records based on fields identified according to log file framework 124 and passes the records to a record parser 406. Record parser 406 tokenizes data and contents in the identified fields and sends the data and contents for each field to a corresponding decompression engine assigned to the type of field, from among message decompression engine 408, time decompression engine 410, exception decompression engine 412, severity decompression engine 414, and other field decompression engine 416. In the example, message decompression engine 408 decompresses the data compressed by message compression engine 208, time decompression engine 410 decompressed the data compressed by time compression engine 210, exception decompression engine 412 decompresses the data compressed by exception compression engine 212, severity decompression engine 414 decompresses the data compressed by severity compression engine 214, and other field decompression engine 416 decompresses the data compressed by other field decompression engine 416. In the example, the decompression engines each decompress the data associated with the field specified for the decompression engine and send the decompressed output for the field to a log formatter 418. Each of the decompression engines may access or index a dictionary 430 for improving the efficiency of decompressing redundant content. Log formatter 418 assembles each field and the decompressed contents of the field into the original pattern that the fields and content appeared in the original log file, after the corresponding compression engines decompress each field, and outputs decompressed log file 420.

Figure 5:
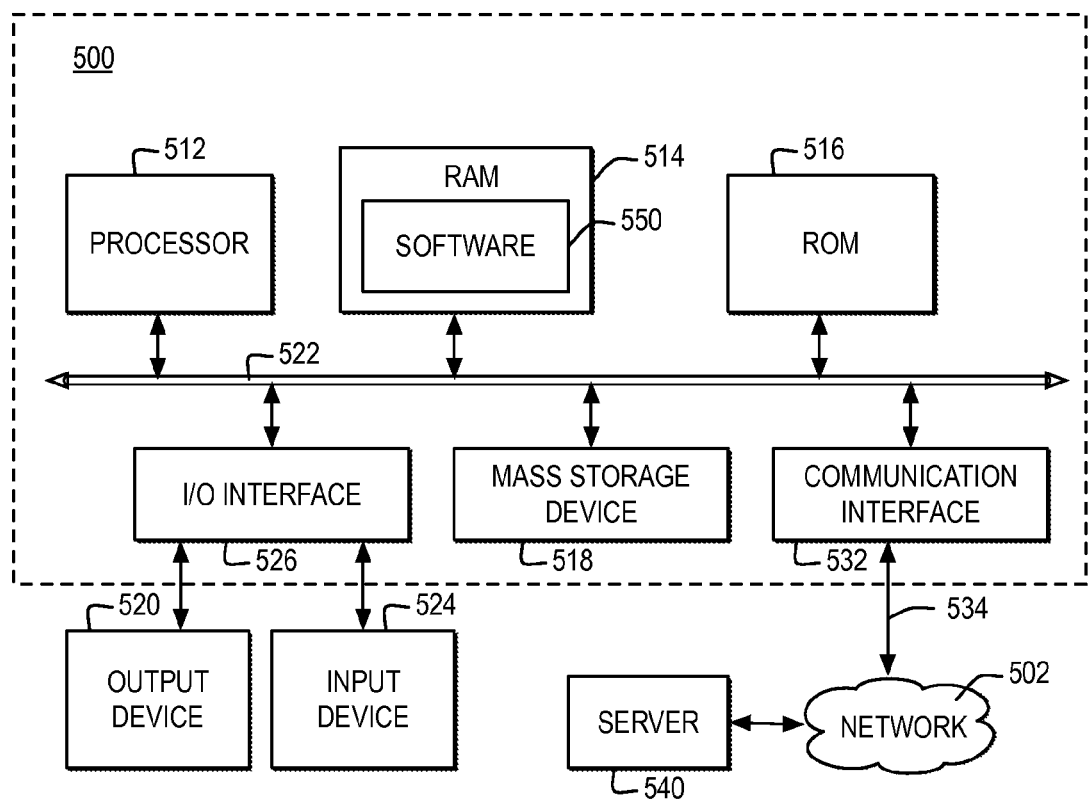
FIG. 5 illustrates one example of a computer system in which a system according to FIGS. 1, 2, 3 and 4 may be implemented and processes and programs according to FIGS. 6, 7, and 8 may be performed.
Figure 6:
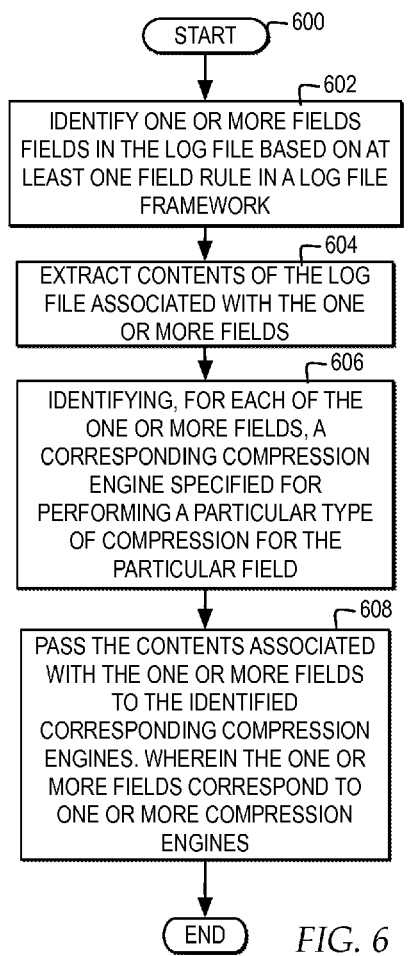
FIG. 6 illustrates a high level logic flowchart for parsing a log file based into content components associated with fields based on field rules in a log file framework.
Figure 7:
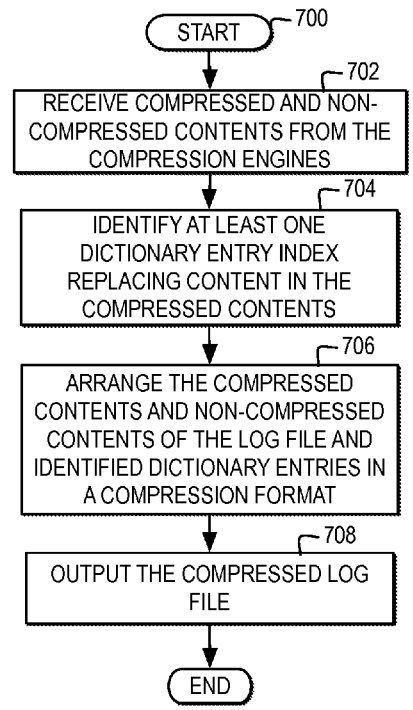
FIG. 7 illustrates a high level logic flowchart for managing compression of compressed and non-compressed contents of a log file from multiple compressing engines.
Figure 8:
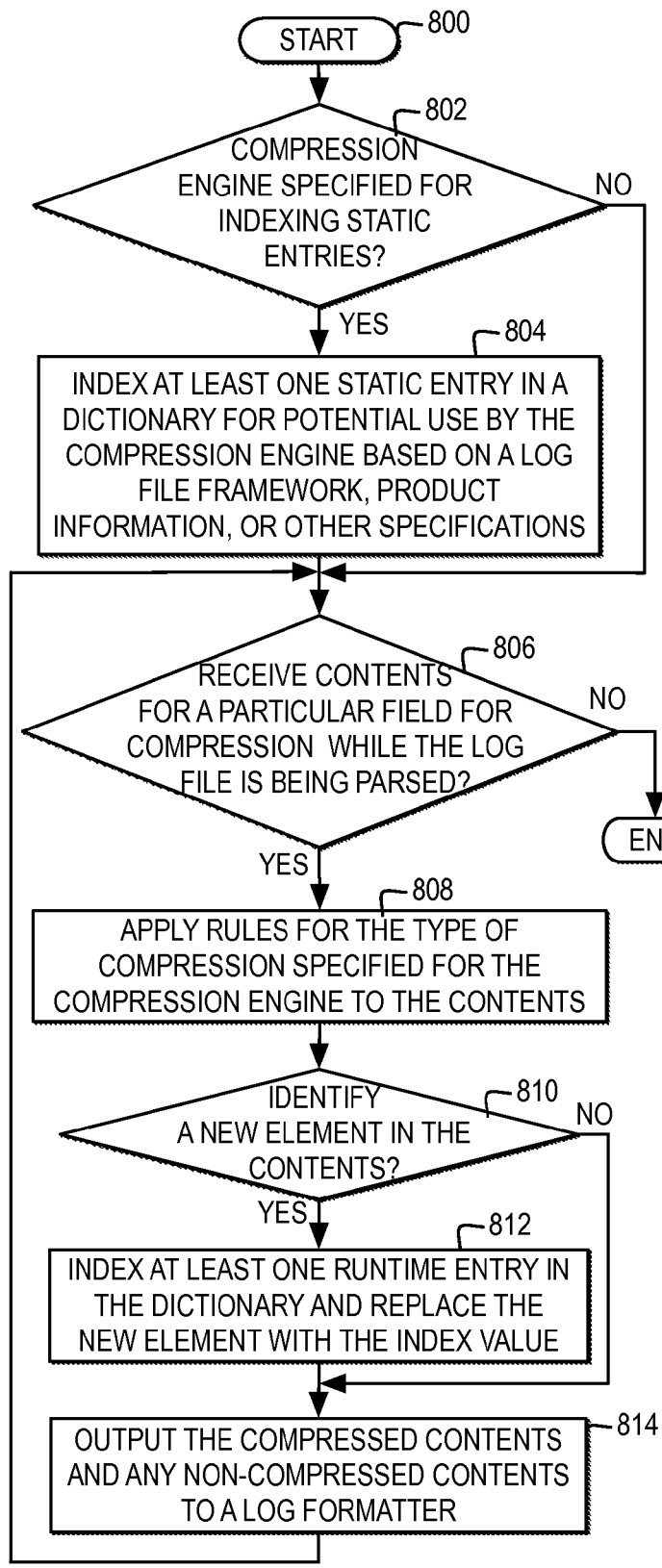
FIG. 8 illustrates a high level logic flowchart for managing compression by a particular compression engine specified for optimizing compression of contents of at least one type of field.

FIG. 5 illustrates one example of a computer system in which a system according to FIGS. 1, 2, 3 and 4 may be implemented and processes and programs according to FIGS. 6, 7, and 8 may be performed. The present invention may be performed in a variety of systems and combinations of systems, made up of functional components, such as the functional components described with reference to computer system 500 and may be communicatively connected to a network, such interconnection network 536.

Computer system 500 includes a bus 522 or other communication device for communicating information within computer system 500, and at least one hardware processing device, such as processor 512, coupled to bus 522 for processing information. Bus 522 preferably includes low-latency and higher latency paths that are connected by bridges and adapters and controlled within computer system 500 by multiple bus controllers. When implemented as a server or node, computer system 500 may include multiple processors designed to improve network servicing power. Where multiple processors share bus 522, additional controllers (not depicted) for managing bus access and locks may be implemented.

Processor 512 may be at least one general-purpose processor such as IBM® PowerPC® (IBM and PowerPC are registered trademarks of International Business Machines Corporation) processor that, during normal operation, processes data under the control of software 550, which may include at least one of application software, an operating system, middleware, and other code and computer executable programs accessible from a dynamic storage device such as random access memory (RAM) 514, a static storage device such as Read Only Memory (ROM) 516, a data storage device, such as mass storage device 518, or other data storage medium. Software 550 may include, but is not limited to, code, applications, protocols, interfaces, and processes for controlling one or more systems within a network including, but not limited to, an adapter, a switch, a cluster system, and a grid environment.

In one embodiment, the operations performed by processor 512 may control the operations of flowcharts of FIGS. 6, 7, and 8 and other operations described herein. Operations performed by processor 512 may be requested by software 550 or other code or the steps of one embodiment of the invention might be performed by specific hardware components that contain hardwired logic for performing the steps, or by any combination of programmed computer components and custom hardware components.

Those of ordinary skill in the art will appreciate that aspects of one embodiment of the invention may be embodied as a system, method or computer program product. Accordingly, aspects of one embodiment of the invention may take the form of an entirely hardware embodiment, an entirely software embodiment (including firmware, resident software, microcode, etc.) or an embodiment containing software and hardware aspects that may all generally be referred to herein as "circuit," "module," or "system." Furthermore, aspects of one embodiment of the invention may take the form of a computer program product embodied in one or more tangible computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, such as mass storage device 518, a random access memory (RAM), such as RAM 514, a read-only memory (ROM) 516, an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction executing system, apparatus, or device.

A computer readable signal medium may include a propagated data signal with the computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction executable system, apparatus, or device.

Program code embodied on a computer readable medium may be transmitted using any appropriate medium, including but not limited to, wireless, wireline, optical fiber cable, radio frequency (RF), etc., or any suitable combination of the foregoing.

Computer program code for carrying out operations of on embodiment of the invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, such as computer system 500, partly on the user's computer, as a stand-alone software package, partly on the user's computer and partly on a remote computer or entirely on the remote computer or server. In the latter scenario, the remote computer may be connected to the user's computer through any type of network, such as interconnection network 536, through a communication interface, such as network interface 532, over a network link that may be connected, for example, to interconnection network 536.

In the example, network interface 532 includes an adapter 534 for connecting computer system 500 to interconnection network 536 through a link. Although not depicted, network interface 532 may include additional software, such as device drivers, additional hardware and other controllers that enable communication. When implemented as a server, computer system 500 may include multiple communication interfaces accessible via multiple peripheral component interconnect (PCI) bus bridges connected to an input/output controller, for example. In this manner, computer system 500 allows connections to multiple clients via multiple separate ports and each port may also support multiple connections to multiple clients.

One embodiment of the invention is described below with reference to flowchart illustrations and/or block diagrams of methods, apparatus (systems) and computer program products according to embodiments of the invention. Those of ordinary skill in the art will appreciate that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, such as computer system 500, or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer, such as computer system 500, or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks Network interface 532, the network link to interconnection network 536, and interconnection network 536 may use electrical, electromagnetic, or optical signals that carry digital data streams. The signals through the various networks and the signals on interconnection network 536, the network link to interconnection network 536, and network interface 532 which carry the digital data to and from computer system 500, may be forms of carrier waves transporting the information.

In addition, computer system 500 may include multiple peripheral components that facilitate input and output. These peripheral components are connected to multiple controllers, adapters, and expansion slots, such as input/output (I/O) interface 526, coupled to one of the multiple levels of bus 522. For example, input device 524 may include, for example, a microphone, a video capture device, an image scanning system, a keyboard, a mouse, or other input peripheral device, communicatively enabled on bus 522 via I/O interface 526 controlling inputs. In addition, for example, output device 520 communicatively enabled on bus 522 via I/O interface 526 for controlling outputs may include, for example, one or more graphical display devices, audio speakers, and tactile detectable output interfaces, but may also include other output interfaces. In alternate embodiments of the present invention, additional or alternate input and output peripheral components may be added.

Those of ordinary skill in the art will appreciate that the hardware depicted in FIG. 5 may vary. Furthermore, those of ordinary skill in the art will appreciate that the depicted example is not meant to imply architectural limitations with respect to the present invention.

FIG. 6 illustrates a high level logic flowchart for parsing a log file based into content components associated with fields based on field rules in a log file framework. As illustrated, the process starts at block 600 and thereafter proceeds to block 602. Block 602 illustrates identifying one or more fields in the log file based at least one field rule in a log file framework. In one example, at block 602, fields 102, 104, 106, 108, 110, 112, 114, and 116 are identified in log file 130. Next, block 604 illustrates extracting the contents associated with the one or more fields from the one or more fields of the log file. In one embodiment, record extractor 204 extracts the contents associated with the one or more fields. Thereafter, block 606 illustrates identifying, for each of the one or more fields, a corresponding compression engine specified for performing a particular type of compression for each particular field. For example, if the log file includes a message field, a time field and an exception field, then record parser 206 identifies a separate compression engine specified for compression for each of the message field, the time field and the exception field. Next, block 608 illustrates passing the contents associated with the one or more fields to the identified corresponding compression engines, wherein the one or more fields each correspond to one or more compression engines, and the process ends.

FIG. 7 illustrates a high level logic flowchart for managing compression of compressed and non-compressed contents of a log file from multiple compressing engines. As illustrated, the process starts at block 700 and thereafter proceeds to block 702. Block 702 illustrates receiving compressed and non-compressed contents from the multiple compression engines, wherein each of the contents is associated with a field of the log file. Block 704 illustrates identifying at least one dictionary entry index replacing content in the compressed contents. Block 706 illustrates arranging the compressed and non-compressed contents of the log file and identified dictionary entries in a compression format reflecting the format of the original, uncompressed log file. Next, block 708 illustrates outputting the compressed log file, including displaying the compressed log file, storing the compressed log file in memory, or transferring the compressed log file via a network, and the process ends.

FIG. 8 illustrates a high level logic flowchart for managing compression by a particular compression engine specified for optimizing compression of contents of at least one type of field. As illustrated, the process starts at block 800 and thereafter proceeds to block 802. Block 802 illustrates a determination whether the compression engine is specified for indexing static entries based on rules for the type of compression specified for the compression engine. If the compression engine is specified for indexing static entries, then the process passes to block 804. Block 804 illustrates indexing at least one static entry in a dictionary for potential use by the compression engine, where the static entry is based on entries in a log file framework, product information, or other specifications relevant to the type of compression performed by the particular compression engine. Next, block 806 illustrates a determination whether contents are received for a particular field of a log file for compression, while the log file is being parsed. If a compression engine does not receive contents for a log file while the log file is being parsed, then the process ends. If a compression engine does receive contents for a particular field of the log file for compression, then the process passes to block 808. Block 808 illustrates applying rules for the type of compression specified for the compression engine, to the contents, for optimizing compression of the contents of the particular field associated with the compression engine. Next, block 810 illustrates a determination whether any new elements are identified in the contents. If new elements are identified in the contents, then the process passes to block 812. Block 812 illustrates indexing at least one runtime entry in the dictionary for the new element and replacing the new element in the contents with the index value, and the process passes to block 814.

Returning to block 810, if no new elements are identified in the contents, then the process passes to block 814. Block 814 illustrates outputting the compressed contents and any non-compressed contents to a log formatter, and the process returns to block 806.

Various embodiments of the invention described above may provide at least, but are not limited to, the a method for modifying size of a data file by compressing different fields of the log file using different compression techniques, in parallel. The different compression techniques are applied to the different fields of the log file so as to reduce the size of the log file to maximum extent. The compressed log file can also be decompressed using decompression rules.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method for compressing a log file, the method comprising:
   identifying by one or more processors, two or more fields in a log file based on two or more field rules from among a plurality of field rules specified in a log file framework;
   extracting, by the one or more processors, contents of the log file associated with the two or more fields;
   passing, by the one or more processors, the contents associated with the two or more fields to two or more corresponding compression engines from among a plurality of compression engines each specified for performing a separate type of compression from among a plurality of types of compression for each of the two or more fields, wherein each of the two or more fields corresponds to one or more compression engines from among the plurality of compression engines;
   receiving, by the one or more processors, a plurality of outputs from each of the one or more compression engines, wherein the plurality of outputs comprise compressed contents and uncompressed contents, wherein the compressed contents comprise at least one content element replaced by one or more of the two or more compression engines by a dictionary entry index into at least one entry in a dictionary shared among the two or more compression engines for replacing redundant elements among the two or more compression engines;
   identifying, by the one or more processors, the at least one dictionary entry index in the compressed contents, wherein the at least one dictionary entry index is an index value assigned by the one or more compression engines to a text string in the dictionary;
   arranging, by the one or more processors, the compressed contents, uncompressed contents, and each text string from the dictionary associated with each identified at least one dictionary entry index in a predefined format for a compressed log file; and
   outputting, by the one or more processors, the compressed log file.

2. The method of claim 1, further comprising:
   receiving, by the one or more processors, the log file as generated by a log file generator monitoring an application;
   identifying, by the one or more processors, the two or more fields in the log file based on the two or more field rules from among the plurality of field rules specified in the log file framework, wherein the plurality of field rules comprise at least one general field rule that specifies rules for one or more general fields common across a plurality of log files created by a plurality of separate applications and at least one application specific field rule that specifies rules for one or more specific fields that are specific to a particular application from among the plurality of separate applications for which the log file is created; and
   generating, by the one or more processors, the compressed log file based on the plurality of field rules in the log file framework.

3. The method according to claim 2, further comprising:
   accessing, by the one or more processors, from the at least one application specific field rule, at least one resource bundle specifying at least one text string available for formatting messages in the log file, wherein each at least one text string is identified by an index number;
   identifying, by the one or more processors, by a particular compression engine specified for indexing static entries from among the plurality of compression engines, the at least one text string within the contents of the log file; and
   replacing, by the one or more processors, the at least one text string within the contents of the log file with the index number.

4. The method of claim 1, further comprising compressing, by the one or more processors, the contents associated with each of the two or more fields by applying at least one separate compression rule specified for each type of compression by each of the corresponding compression engines receiving the contents.

5. The method of claim 4, further comprising decompressing, by the one or more processors, the compressed contents of the two or more fields based on predefined decompression rules.

6. The method of claim 1, further comprising compressing, by the one or more processors, the contents associated with two or more fields by each of the plurality of compression engines by replacing the contents with predefined contents.

7. The method of claim 6, wherein replacing, by the one or more processors, the contents further comprises substituting the contents associated with two or more fields with one or more index numbers each assigned to a separate text string.

8. The method according to claim 1, further comprising:
   receiving, by a particular compression engine specified for a particular type of compression for at least one particular field from among the two or more fields, contents for the at least one particular field;
   applying, by the particular compression engine, at least one particular compression rule specified for the particular compression engine, wherein applying the at least one particular compression rule comprises searching the dictionary for each content element within the contents;
   in response to identifying a particular content element within the contents within a particular entry of the dictionary, replacing, by the particular compression engine, the particular content element with an index number of the particular entry in the dictionary;
   in response to identify a new content element within the contents that is not included in the dictionary, adding, by the particular compression engine, the new content element as a new entry of the dictionary and replacing the new content element with a new index number of the new entry; and
   outputting, by the particular compression engine, compressed content elements of the content comprising the index number and the new index number and one or more uncompressed content elements of the content.

9. A system for compressing a log file, comprising:
   one or more processors;
   a compression system, for execution by at least one of the one or more processors and operative to identify two or more fields in a log file based on two or more field rules from among a plurality of field rules specified in a log file framework;
   the compression system operative to extract contents of the log file associated with the two or more fields;
   the compression system operative to pass the contents associated with the two or more fields to two or more corresponding compression engines from among a plurality of compression engines each specified for performing a separate type of compression from among a plurality of types of compression for each of the two or more fields, wherein each of the two or more fields corresponds to one or more compression engines from among the plurality of compression engines;

the compression system operative to receive a plurality of outputs from each of the two or more compression engines, wherein the plurality of outputs comprise compressed contents and uncompressed contents, wherein the compressed contents comprise at least one content element replaced by one or more of the two or more compression engines by a dictionary entry index into at least one entry in a dictionary shared among the two or more compression engines for replacing redundant elements among the two or more compression engines;

the compression system operative to identify the at least one dictionary entry index in the compressed contents, wherein the at least one dictionary entry index is an index value assigned by the one or more compression engines to a text string in the dictionary;

the compression system operative to arrange the compressed contents, uncompressed contents, and each text string from the dictionary associated with each identified at least one dictionary entry index in a predefined format for a compressed log file; and the compression system operative to output the compressed log file.

10. The system of claim 9, further comprising:

the compression system operative to receive the log file as generated by a log file generator monitoring an application;

the compression system operative to identify the two or more fields in the log file based on the two or more field rules from among the plurality of field rules specified in the log file framework, wherein the plurality of field rules comprise at least one general field rule that specifies rules for one or more general fields common across a plurality of log files created by a plurality of separate applications and at least one application specific field rule that specifies rules for one or more specific fields that are specific to a particular application from among the plurality of separate applications for which the log file is created; and the compression system operative to generate the compressed log file based on the plurality of field rules in the log file framework.

11. The system of claim 9, further comprising the compression system operative to compress the contents associated with each of the two or more fields by applying at least one separate compression rule specified for each type of compression by each of the corresponding compression engines receiving the contents.

12. The system of claim 11, further comprising the compression system operative to decompress the compressed contents of the two or more fields based on predefined decompression rules.

13. The system of claim 9, further comprising the compression system operative to compress the contents associated with two or more fields by each of the plurality of compression engines by replacing the contents with predefined contents.

14. The system of claim 13, further comprising the compression system operative to replace the contents by substituting the contents associated with two or more fields with one or more index numbers each assigned to a separate text string.

15. A computer program product for compressing a log file, the computer program product comprising:

one or more computer-readable tangible storage devices;

program instructions, stored on at least one of the one or more storage devices, to identify two or more fields in a log file based on two or more field rules from among a plurality of field rules specified in a log file framework;

program instructions, stored on at least one of the one or more storage devices, to extract contents of the log file associated with the two or more fields;

program instructions, stored on at least one of the one or more storage devices, to pass the contents associated with the two or more fields to corresponding compression engines from among a plurality of compression engines each specified for performing a separate type of compression from among a plurality of types of compression for each of the two or more fields, wherein each of the two or more fields corresponds to one or more compression engines from among the plurality of compression engines program instructions, stored on at least one of the one or more storage devices, to receive a plurality of outputs from each of the two or more compression engines, wherein the plurality of outputs comprise compressed contents and uncompressed contents, wherein the compressed contents comprise at least one content element replaced by one or more of the two or more compression engines by a dictionary entry index into at least one entry in a dictionary shared among the two or more compression engines for replacing redundant elements among the two or more compression engines;

program instructions, stored on at least one of the one or more storage devices, to identify the at least one dictionary entry index in the compressed contents, wherein the at least one dictionary entry index is an index value assigned by the one or more compression engines to a text string in the dictionary;

program instructions, stored on at least one of the one or more storage devices, to arrange the compressed contents, uncompressed contents and each text string from the dictionary associated with each identified at least one dictionary entry index in a predefined format for a compressed log file; and program instructions, stored on at least one of the one or more storage devices, to output the compressed log file.

16. The computer program product of claim 15, the computer program product further comprising:

program instructions, stored on at least one of the one or more storage devices, to receive the log file as generated by a log file generator monitoring an application;

program instructions, stored on at least one of the one or more storage devices to identify the two or more fields in the log file based on the two or more field rules from among the plurality of field rules specified in the log file framework, wherein the plurality of field rules comprise at least one general field rule that specifies rules for one or more general fields common across a plurality of log files created by a plurality of separate applications and at least one application specific field rule that specifies rules for one or more specific fields that are specific to a particular application from among the plurality of separate applications for which the log file is created; and program instructions, stored on at least one of the one or more storage devices, to generate the compressed log file based on the plurality of field rules in the log file framework.

17. The computer program product of claim 15, the computer program product further comprising:
  program instructions, stored on at least one of the one or more storage devices, to compress the contents associated with each of the two or more fields by applying at least one separate compression rule specified for each type of compression by each of the corresponding compression engines receiving the contents.

18. The computer program product of claim 17, further comprising program instructions, stored on at least one of the one or more storage devices, to decompress the compressed contents of the two or more fields based on predefined decompression rules.

19. The computer program product of claim 17, further comprising program instructions, stored on at least one of the one or more storage devices, to compress the contents associated with two or more fields by each of the plurality of compression engines by replacing the contents with predefined contents.

\* \* \* \* \*